United States Patent
Guo et al.

(10) Patent No.: US 11,737,253 B2
(45) Date of Patent: Aug. 22, 2023

(54) UNIFORM LAYOUTS FOR SRAM AND REGISTER FILE BIT CELLS

(71) Applicant: Intel Corporation, Santa Clara, CA (US)

(72) Inventors: Zheng Guo, Portland, OR (US); Clifford L. Ong, Portland, OR (US); Eric A. Karl, Portland, OR (US); Mark T. Bohr, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 494 days.

(21) Appl. No.: 16/605,903

(22) PCT Filed: Jun. 22, 2017

(86) PCT No.: PCT/US2017/038681
§ 371 (c)(1),
(2) Date: Oct. 17, 2019

(87) PCT Pub. No.: WO2018/236377
PCT Pub. Date: Dec. 27, 2018

(65) Prior Publication Data
US 2020/0058656 A1    Feb. 20, 2020

(51) Int. Cl.
*H10B 10/00* (2023.01)
*H01L 23/528* (2006.01)
(Continued)

(52) U.S. Cl.
CPC ........... *H10B 10/12* (2023.02); *H01L 23/528* (2013.01); *H01L 27/0207* (2013.01); *H01L 27/0924* (2013.01)

(58) Field of Classification Search
None
See application file for complete search history.

(56) References Cited

U.S. PATENT DOCUMENTS 9,824,748 B1 * 11/2017 Zang ..................... H01L 21/84
9,853,033 B2    12/2017 Liaw
(Continued)

FOREIGN PATENT DOCUMENTS

| KR | 10-2013-0012945 | 2/2013 |
| KR | 10-2015-0125540 | 11/2015 |
| WO | WO 2016117288 | 7/2016 |

OTHER PUBLICATIONS

International Preliminary Report on Patentability for International Patent Application No. PCT/US2017/038681, dated Jan. 2, 2020, 7 pgs.
(Continued)

*Primary Examiner* — Aaron J Gray
*Assistant Examiner* — Christopher A Culbert
(74) *Attorney, Agent, or Firm* — Schwabe, Williamson & Wyatt, P.C.

(57) ABSTRACT

Uniform layouts for SRAM and register file bit cells are described. In an example, an integrated circuit structure includes a six transistor (6T) static random access memory (SRAM) bit cell on a substrate. The 6T SRAM bit cell includes first and second active regions parallel along a first direction of the substrate. First, second, third and fourth gate lines are over the first and second active regions, the first, second, third and fourth gate lines parallel along a second direction of the substrate, the second direction perpendicular to the first direction.

8 Claims, 13 Drawing Sheets

(51) Int. Cl.
    *H01L 27/02*     (2006.01)
    *H01L 27/092*     (2006.01)

(56)     References Cited

U.S. PATENT DOCUMENTS

| | | |
|---|---|---|
| 10,096,608 B2 | 10/2018 | Morimoto et al. |
| 10,153,264 B2 | 12/2018 | Hirose |
| 2006/0131609 A1 | 6/2006 | Kinoshita |
| 2008/0122008 A1 | 5/2008 | Schroeder et al. |
| 2009/0173971 A1 | 7/2009 | Houston et al. |
| 2010/0155848 A1 | 6/2010 | Pillarisetty |
| 2011/0031473 A1 | 2/2011 | Chang et al. |
| 2014/0003133 A1* | 1/2014 | Lin ................ G11C 11/412 716/55 |
| 2014/0315363 A1* | 10/2014 | Balakrishnan ...... H01L 29/0673 438/233 |
| 2015/0014775 A1 | 1/2015 | Seo |
| 2015/0364459 A1* | 12/2015 | Chuang ............. H01L 27/092 257/372 |
| 2017/0317065 A1* | 11/2017 | Hirose ............... G11C 11/418 |

OTHER PUBLICATIONS

Search Report from European Patent Application No. 17914579.2, dated Dec. 8, 2020, 6 pgs.
International Search Report and Written Opinion for International Patent Application No. PCT/US2017/038681 dated Feb. 20, 2018, 10 pgs.
Office Action for Korean Patent Application No. 10-2019-7034433 dated Jun. 30, 2022, 5 pgs., with English translation.

\* cited by examiner

UNIFORM LAYOUTS FOR SRAM AND REGISTER FILE BIT CELLS

CROSS-REFERENCE TO RELATED APPLICATION

This patent application is a U.S. National Phase Application under 35 U.S.C. § 371 of International Application No. PCT/US2017/038681, filed Jun. 22, 2017, entitled "UNIFORM LAYOUTS FOR SRAM AND REGISTER FILE BIT CELLS," which designates the United States of America, the entire disclosure of which is hereby incorporated by reference in its entirety and for all purposes.

TECHNICAL FIELD

Embodiments of the disclosure are in the field of integrated circuit structures and, in particular, uniform layouts for SRAM and register file bit cells.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips.

For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant. In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and compatibility with the existing high-yielding bulk silicon substrate infrastructure. Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

Variability in conventional and state-of-the-art fabrication processes may limit the possibility to further extend them into the, e.g. 10 nm or sub-10 nm range. Consequently, fabrication of the functional components needed for future technology nodes may require the introduction of new methodologies or the integration of new technologies in current fabrication processes or in place of current fabrication processes. New layouts may be introduced either to accommodate or to enable such future technology nodes.

DESCRIPTION OF THE EMBODIMENTS

Figure 1A:
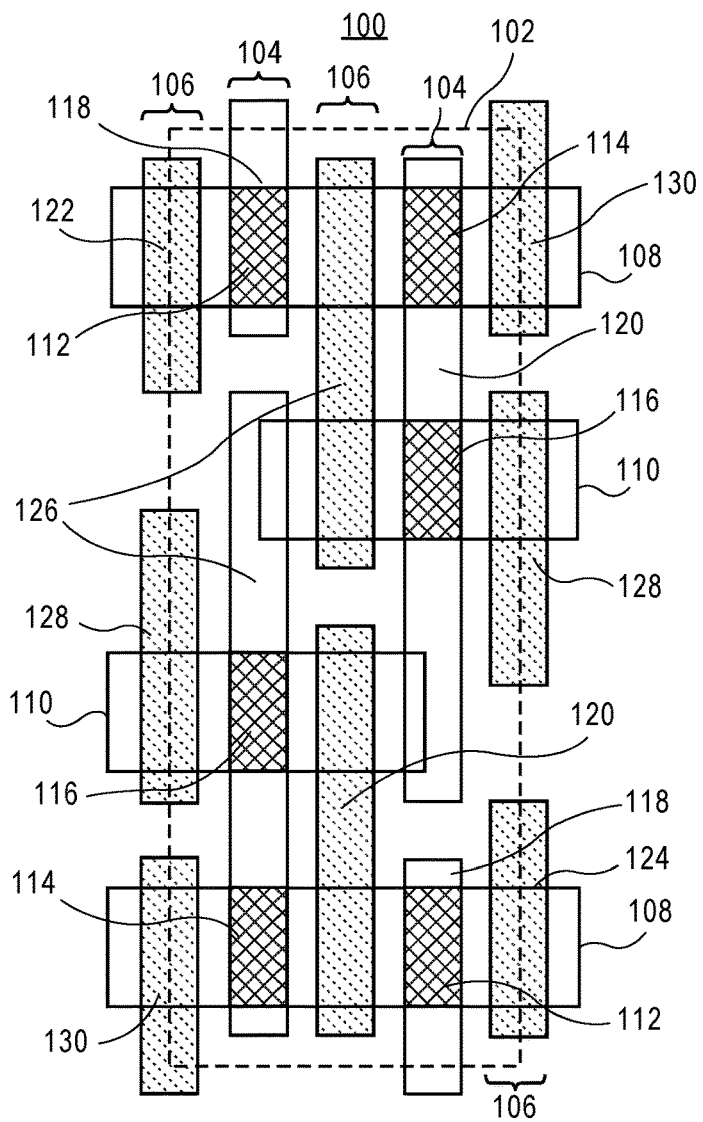
FIGS. 1A and 1B illustrate a bit cell layout and a schematic diagram, respectively, for a conventional six transistor (6T) static random access memory (SRAM).

Uniform layouts for SRAM and register file bit cells are described. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

One or more embodiments described herein are directed to uniform mask memory designs. Particular embodiments may include a layout-efficient technique of implementing 6-transistor SRAM (6T SRAM) and 8-transistor register file (8T RF) bit cells in advanced self-aligned process technologies.

To provide context, in conventional 6T SRAM and 8T RF bit cell layouts, the patterns created by trench contact plug formation, gate line plug formation, and fin trim are non-uniform. Such non-uniformity may not be compatible with advanced self-aligned process technology which may require uniform plug and mask patterns for such base layers. In order to accommodate conventional 6T SRAM and 8T RF layout under a given set of design rules, the corresponding bit cell would likely have to incur significant growth in terms of area, or alternatively, significant process risks may need to be taken by breaking uniform plug/mask pattern requirements.

Figure 1B:
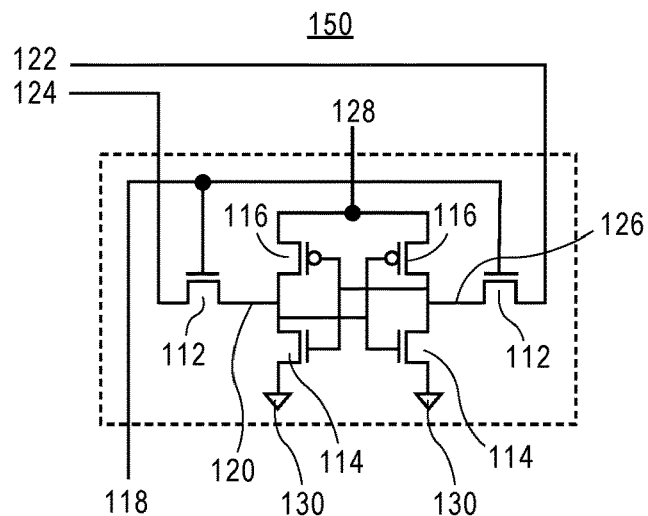

For comparison with embodiments of the present disclosure, FIGS. 1A and 1B illustrate a bit cell layout 100 and a schematic diagram 150, respectively, for a conventional six transistor (6T) static random access memory (SRAM).

Referring to FIGS. 1A and 1B, a bit cell area 102 includes therein gate lines 104 (which may also be referred to as poly lines). Trench contact lines 106 alternate with the gate lines 104. The gate lines 104 and trench contact lines 106 are over NMOS diffusion regions 108 (e.g., P-type doped active regions, such as boron doped diffusion regions of an underlying substrate) and PMOS diffusion regions 110 (e.g., N-type doped active regions, such as phosphorous and/or arsenic doped diffusion regions of an underlying substrate). In the example of FIG. 1A, each of the NMOS diffusion regions 108 and the PMOS diffusion regions 110 has the same gate "width" which may be, e.g., a single semiconductor fin. Access transistors 112, N-type cell transistors 114, and P-type cell transistors 116 are formed from the gate lines 104 and the NMOS diffusion regions 108 and the PMOS diffusion regions 110. Also depicted are a wordline (WL) 118, a bit bar (BB) 120, a bit line (BL) 122, a bit line bar (BLB) 124, internal node storage (BT) 126, SRAM VCC 128, and VSS 130.

In contrast to FIGS. 1A and 1B, FIGS. 2A and 2B illustrate a bit cell layout 200 and a schematic diagram 250, respectively, for a uniform six transistor (6T) static random access memory (SRAM), in accordance with an embodiment of the present disclosure.

Figure 2A:
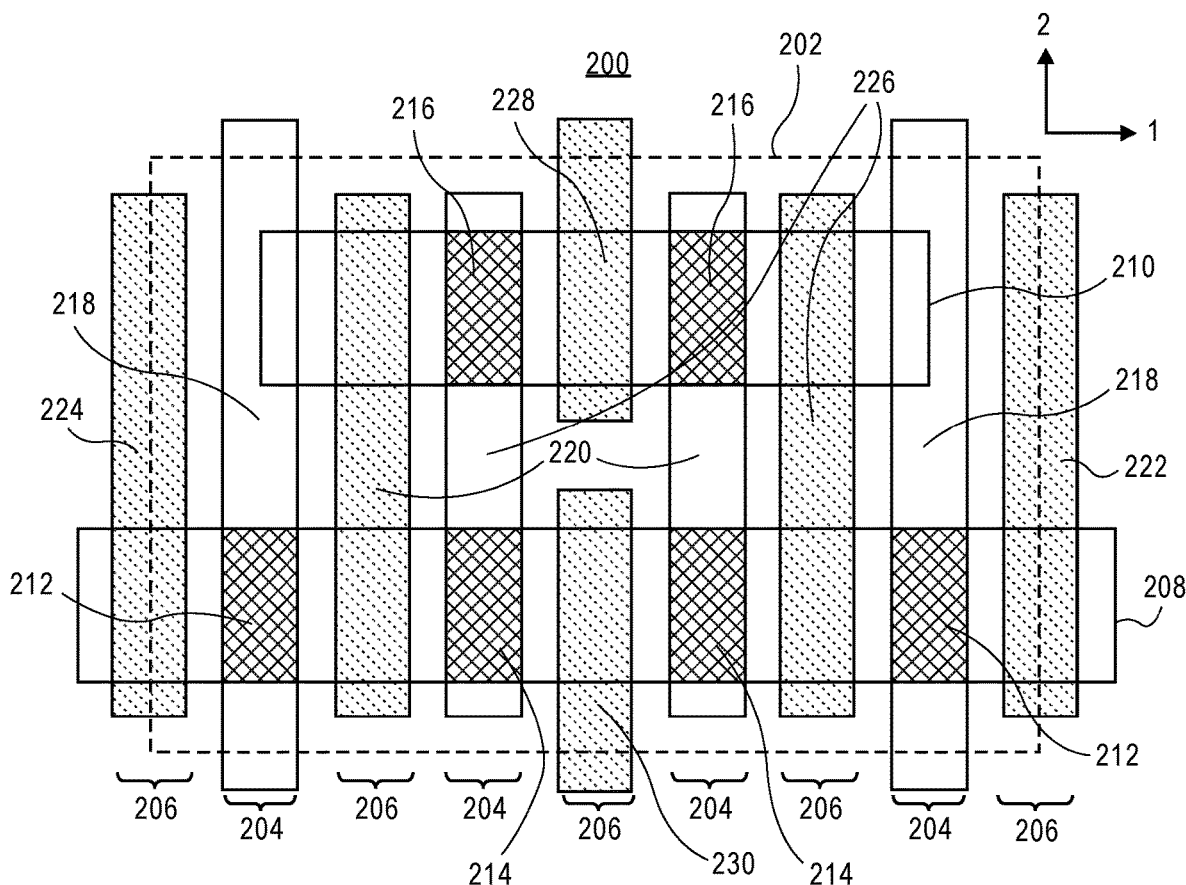
FIGS. 2A and 2B illustrate a bit cell layout and a schematic diagram, respectively, for a uniform six transistor (6T) static random access memory (SRAM), in accordance with an embodiment of the present disclosure.
Figure 2B:
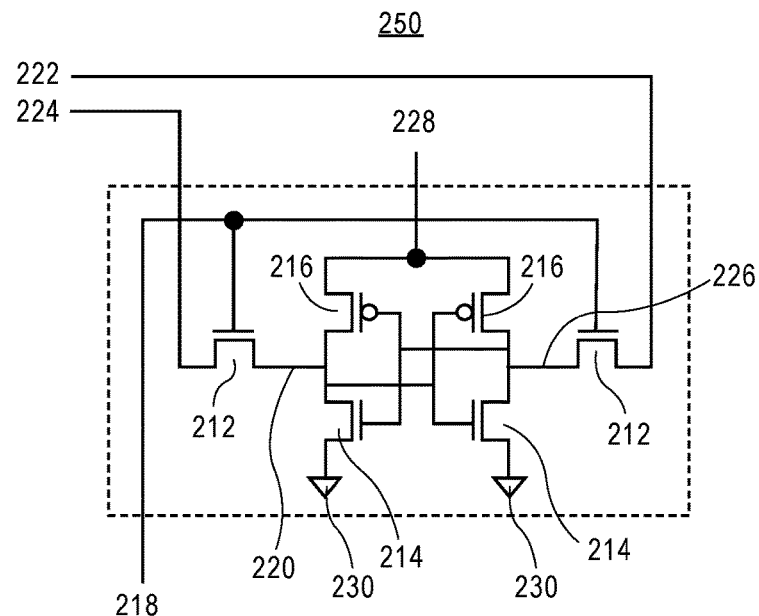

Referring to FIGS. 2A and 2B, a bit cell area 202 includes therein gate lines 204 (which may also be referred to as poly lines). Trench contact lines 206 alternate with the gate lines 204. The gate lines 204 and trench contact lines 206 are over a single NMOS diffusion regions 208 (e.g., a P-type doped active region, such as a boron doped diffusion region of an underlying substrate) and a single PMOS diffusion regions 210 (e.g., an N-type doped active region, such as a phosphorous and/or arsenic doped diffusion region of an underlying substrate). In the example of FIG. 2A, the NMOS diffusion region 208 and the PMOS diffusion region 210 has the same gate "width" which may be, e.g., a single semiconductor fin. Access transistors 212, N-type cell transistors 214, and P-type cell transistors 216 are formed from the gate lines 204 and the NMOS diffusion region 208 and the PMOS diffusion region 210. Also depicted are a wordline (WL) 218, a bit bar (BB) 220, a bit line (BL) 222, a bit line bar (BLB) 224, internal node storage (BT) 226, SRAM VCC 228, and VSS 230.

The layout of FIG. 2A is, in one embodiment, referred to as uniform mask SRAM. In such a uniform Mask 6T SRAM, one inverter-pass gate pair is rotated and flipped so as to abut with the other inverter-pass gate pair. The VCC and VSS terminals of the inverter are shared with the other inverter. In contrast to the four diffusion regions of FIG. 1A, only two diffusion regions are included in the layout of FIG. 2A. Additionally, in contrast to the two gate lines 104 of FIG. 1A, four gate lines 204 are used in the layout of FIG. 2A. As is applicable throughout the present disclosure, the four gate lines 204 may be referred to as being on tracks to form a grating structure. In an embodiment, the term "grating" for gate lines is used herein to refer to a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, the grating-like patterns described herein may have gate lines spaced at a constant pitch and having a constant width. The pattern may be fabricated by a pitch halving or pitch quartering, or other pitch division, approach.

Referring more generally to FIG. 2A, in accordance with an embodiment of the present disclosure, an integrated circuit structure includes a six transistor (6T) static random access memory (SRAM) bit cell 202 on a substrate. The 6T SRAM bit cell 202 includes first 210 and second 208 active regions parallel along a first direction (1) of the substrate. First, second, third and fourth gate lines 204 are over the first 210 and second 208 active regions. The first, second, third and fourth gate lines 204 are parallel along a second direction (2) of the substrate, the second direction (2) perpendicular to the first direction (1).

In one embodiment, the first active region 210 is an N-type doped active region, and the second active region 208 is a P-type doped active region. In one embodiment, the first 210 and second 208 active regions are in first and second silicon fins, respectively. In one embodiment, all individual ones of the first, second, third and fourth gate lines 204 are continuous between the first 210 and second 208 active regions, as is depicted in FIG. 2A. In one embodiment, the 6T SRAM bit cell 202 has a length along the first direction (1) and a length along the second direction (2), and the first length is greater than the second length, as is also depicted in FIG. 2A. In one embodiment, individual ones of the first, second, third and fourth gate lines 204 are spaced apart from one another by trench contact lines 206 parallel along the second direction (2) of the substrate, as is also depicted in FIG. 2A.

Figure 3A:
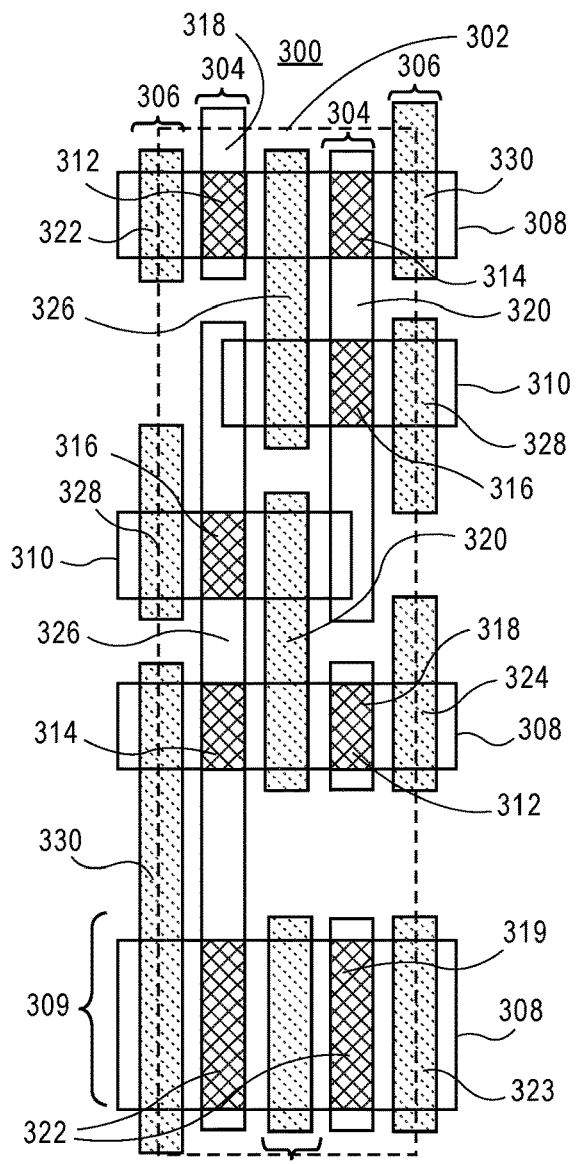
FIGS. 3A and 3B illustrate a bit cell layout and a schematic diagram, respectively, for a conventional eight transistor (8T) register file (RF).
Figure 3B:
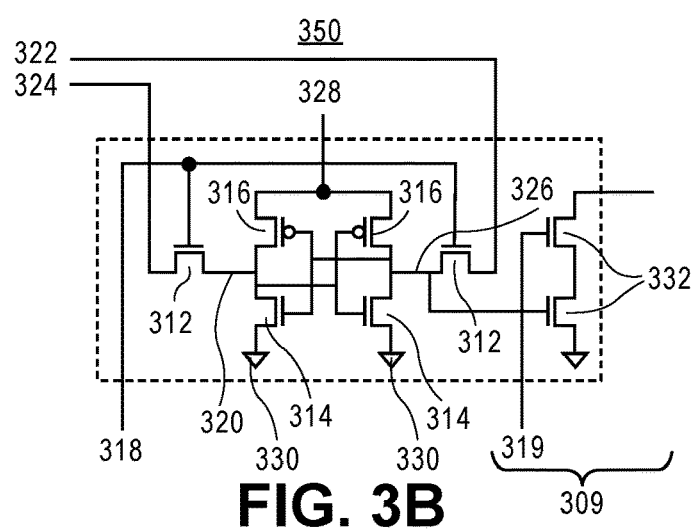

For comparison with embodiments of the present disclosure, FIGS. 3A and 3B illustrate a bit cell layout 300 and a schematic diagram 350, respectively, for a conventional eight transistor (8T) register file (RF).

Referring to FIGS. 3A and 3B, a bit cell area 302 includes therein gate lines 304 (which may also be referred to as poly lines). Trench contact lines 306 alternate with the gate lines 304. The gate lines 304 and trench contact lines 306 are over NMOS diffusion regions 308 (e.g., P-type doped active regions, such as boron doped diffusion regions of an underlying substrate) and PMOS diffusion regions 310 (e.g., N-type doped active regions, such as phosphorous and/or arsenic doped diffusion regions of an underlying substrate). In the example of FIG. 3A, with the exception of the lowermost diffusion region, each of the NMOS diffusion regions 308 and the PMOS diffusion regions 310 has the same gate "width" which may be, e.g., a single semiconductor fin. The lowermost NMOS diffusion region 308 has relatively double the gate "width" which may be, e.g., a pair of semiconductor fins. The lowermost NMOS diffusion region 308 is a diffusion region of a read port 309. Access transistors 312, N-type cell transistors 314, P-type cell transistors 316, and read port transistors (R0, R1) 332 are formed from the gate lines 304 and the NMOS diffusion regions 308 and the PMOS diffusion regions 310. Also depicted are a write wordline (WWL) 318, a read wordline (RWL) 319, a bit bar (BB) 320, a write bit line (BL) 322, a read bit line (BL) 323, a write bit line bar (BLB) 324, internal node storage (BT) 326, RF VCC 328, and VSS 330.

In contrast to FIGS. 3A and 3B, FIGS. 4A and 4B illustrate a bit cell layout and a schematic diagram, respectively, for a uniform eight transistor (8T) register file (RF), in accordance with an embodiment of the present disclosure.

Figure 4A:
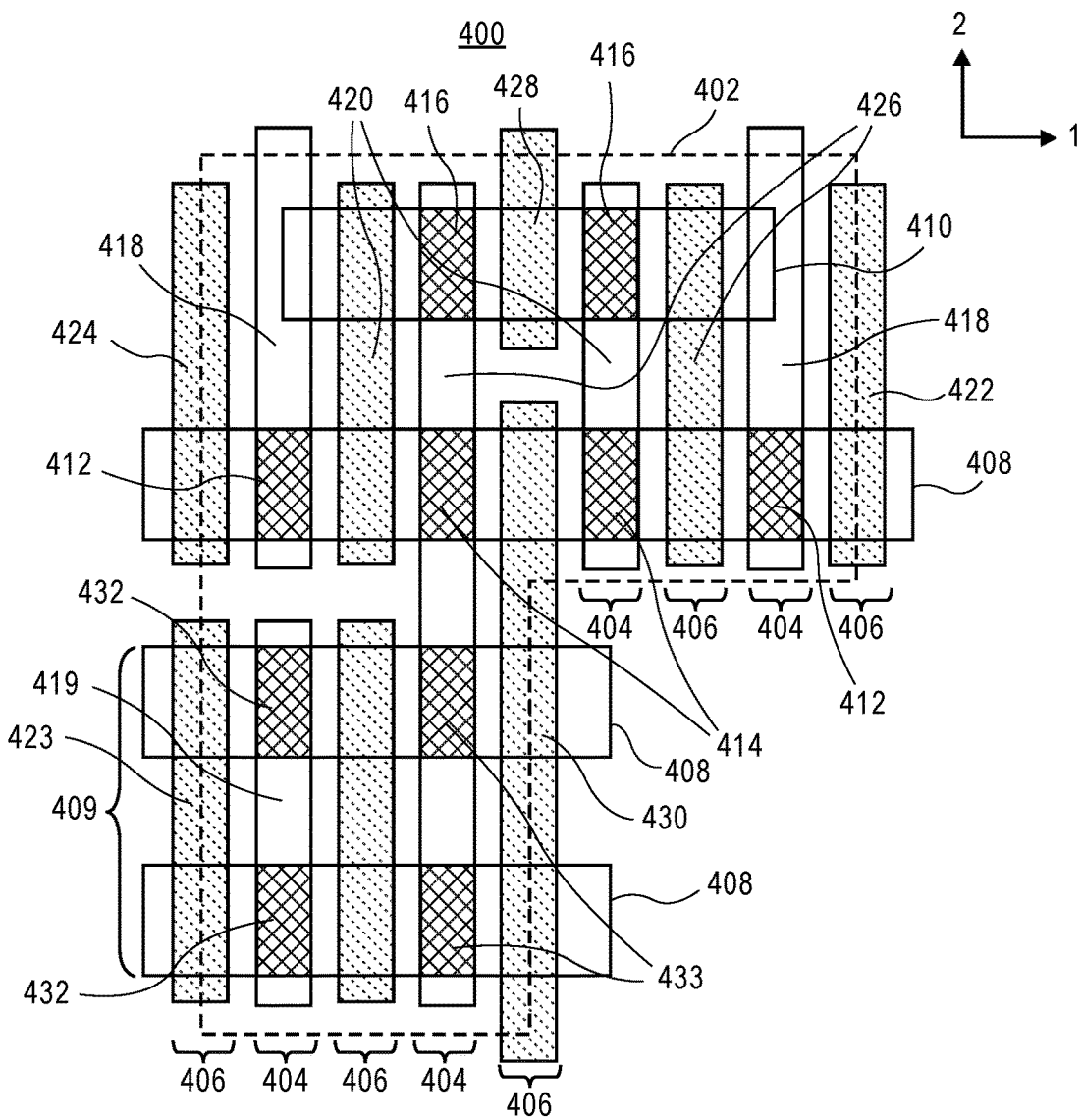
FIGS. 4A and 4B illustrate a bit cell layout and a schematic diagram, respectively, for a uniform eight transistor (8T) register file (RF), in accordance with an embodiment of the present disclosure.
Figure 4B:
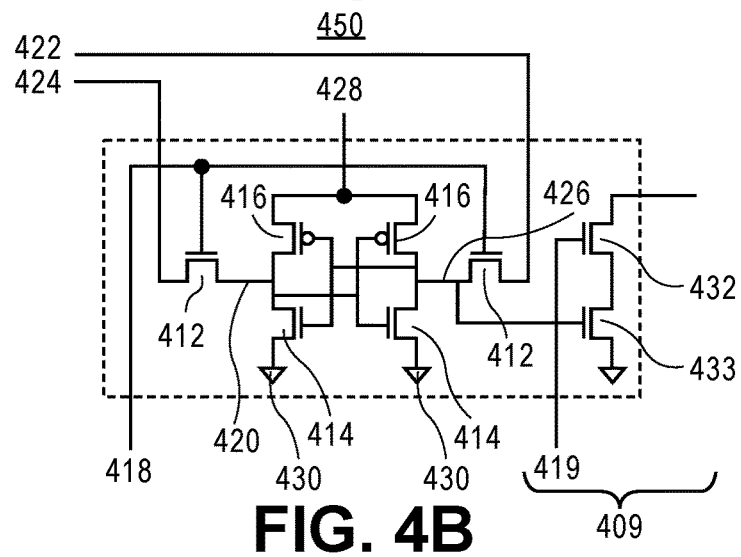

Referring to FIGS. 4A and 4B, a bit cell area 402 includes therein gate lines 404 (which may also be referred to as poly lines). Trench contact lines 406 alternate with the gate lines 404. The gate lines 404 and trench contact lines 406 are over NMOS diffusion regions 408 (e.g., P-type doped active regions, such as boron doped diffusion regions of an underlying substrate) and a single PMOS diffusion region 410 (e.g., an N-type doped active region, such as a phosphorous and/or arsenic doped diffusion region of an underlying substrate). In the example of FIG. 4A, each of the NMOS diffusion regions 408 and the PMOS diffusion region 410 has the same gate "width" which may be, e.g., a single semiconductor fin. Additionally, the lowermost two NMOS diffusion regions 408 are diffusion regions of a read port 409. Access transistors 412, N-type cell transistors 414, P-type cell transistors 416, and read port transistors (R0, R1) 432 and 433 are formed from the gate lines 404 and the NMOS diffusion regions 408 and the PMOS diffusion region 410. Also depicted are a write wordline (WWL) 418, a read wordline (RWL) 419, a bit bar (BB) 420, a write bit line (BL) 422, a read bit line (BL) 423, a write bit line bar (BLB) 424, internal node storage (BT) 426, RF VCC 428, and VSS 430.

The layout of FIG. 4A is, in one embodiment, referred to as uniform mask RF. In such a uniform Mask 8T RF, one inverter-pass gate pair is rotated and flipped so as to abut with the other inverter-pass gate pair. The VCC and VSS terminals of the inverter are shared with the other inverter. The read port is coupled to the storage node (BT) of one of the inverter pair and as a result, forms an L-shaped structure. In contrast to the five diffusion regions of FIG. 3A, only four diffusion regions are included in the layout of FIG. 4A. Additionally, in contrast to the two gate lines 304 of FIG. 3A, four gate lines 404 are used in the layout of FIG. 4A.

Referring more generally to FIG. 4A, in accordance with an embodiment of the present disclosure, an integrated circuit structure includes an eight transistor (8T) register file (RF) bit cell 402 on a substrate. The 8T RF bit cell 402 includes first 410, second 408, third 408 and fourth 408 active regions (from top to bottom of FIG. 4A) parallel along a first direction (1) of the substrate. First and second gate lines 404 (the two gate lines 404 on left-hand side of FIG. 4A) are over the first 410, second 408, third 408 and fourth 408 active regions. The first and second gate lines 404 are parallel along a second direction of the substrate (2), the second direction (2) perpendicular to the first direction (1). Third and fourth gate lines 404 (the two gate lines 404 on right-hand side of FIG. 4A) are over the first 410 and second 408 active region, but not over the third 408 and fourth 408 active regions. The third and fourth gate lines 404 are parallel along the second direction (2) of the substrate.

In one embodiment, the first active region 410 is an N-type doped active region, and the second 408, third 408 and fourth 408 active regions are P-type doped active regions. In one embodiment, the first 410, second 408, third 408 and fourth 408 active regions are in first, second, third and fourth silicon fins, respectively. In one embodiment, the first gate line 404 (furthest to the left) is discontinuous between the second 408 and third 408 active regions, and the second gate line 404 (next furthest to left) is continuous between the second 408 and third 408 active regions, as is depicted in FIG. 4A. In one embodiment, the 8T RF bit cell 402 has an L-shape, as is also depicted in FIG. 4A. In one embodiment, individual ones of the first, second, third and fourth gate lines 408 are spaced apart from one another by trench contact lines 406 parallel along the second direction (2) of the substrate, as is also depicted in FIG. 4A.

In an embodiment, a consistent number of fins is used for all NMOS devices for the 8T RF bit cell. The read port uses two 1-fin NMOS devices to realize a 2-grid device, whereas a 2-fin device is used in the conventional RF. In an embodiment, the same local environment is used for all devices for the 8T RF bit cell. The read port NMOS devices is surrounded by the same 1-fin devices from the inverter NMOS. The write wordline has the same poly and via connections and geometries.

In an embodiment, layouts described herein are compatible with uniform plug and mask patterns, including a uniform fin trim mask. Layouts may be compatible with non-EUV processes. Additionally, layouts may only require use of a uniform rectangular fin trim mask shape. Embodiments described herein may enable increased density in terms of area compared to the conventional 6T SRAM and 8T RF laid out with uniform plug and fin trim patterns.

In an embodiment, power supply terminals are used that are not shared across rows within a column which is a key enabler for row-based circuit techniques (e.g., sleep, assist). In contrast, the conventional 6T SRAM and 8T RF bit cell is limited to column-based circuit techniques due to having shared power terminals across rows within a column. Embodiments may include common and local power and ground (shared source) for the two NMOS and two PMOS devices of the cross coupled inverters inside the 6T SRAM and 8T RF core as well as the read port of the 8T RF bit cell. In one such embodiment, IR-drop, power delivery, and noise immunity of the bit cell are improved.

In an embodiment, for 8T RF, fewer metal-0 layers are required compared to the conventional 8T RF (nominally, about 9 versus about 11). Embodiments may enable improved metal-0 track sharing compared to the conventional 6T SRAM and 8T RF implementation due to usage of more poly pitches (4 versus 2) per physical bit cell. In one such embodiment, flexibility on metal-0 cut locations (e.g., gate versus trench contact) is improved. In an embodiment, the 6T SRAM and the 6T portion of the 8T RF is symmetric along the inverter (P, N) while the pass gate (XT, XB) extends from the inverter N device to form a "butterfly" topology.

Figure 5:
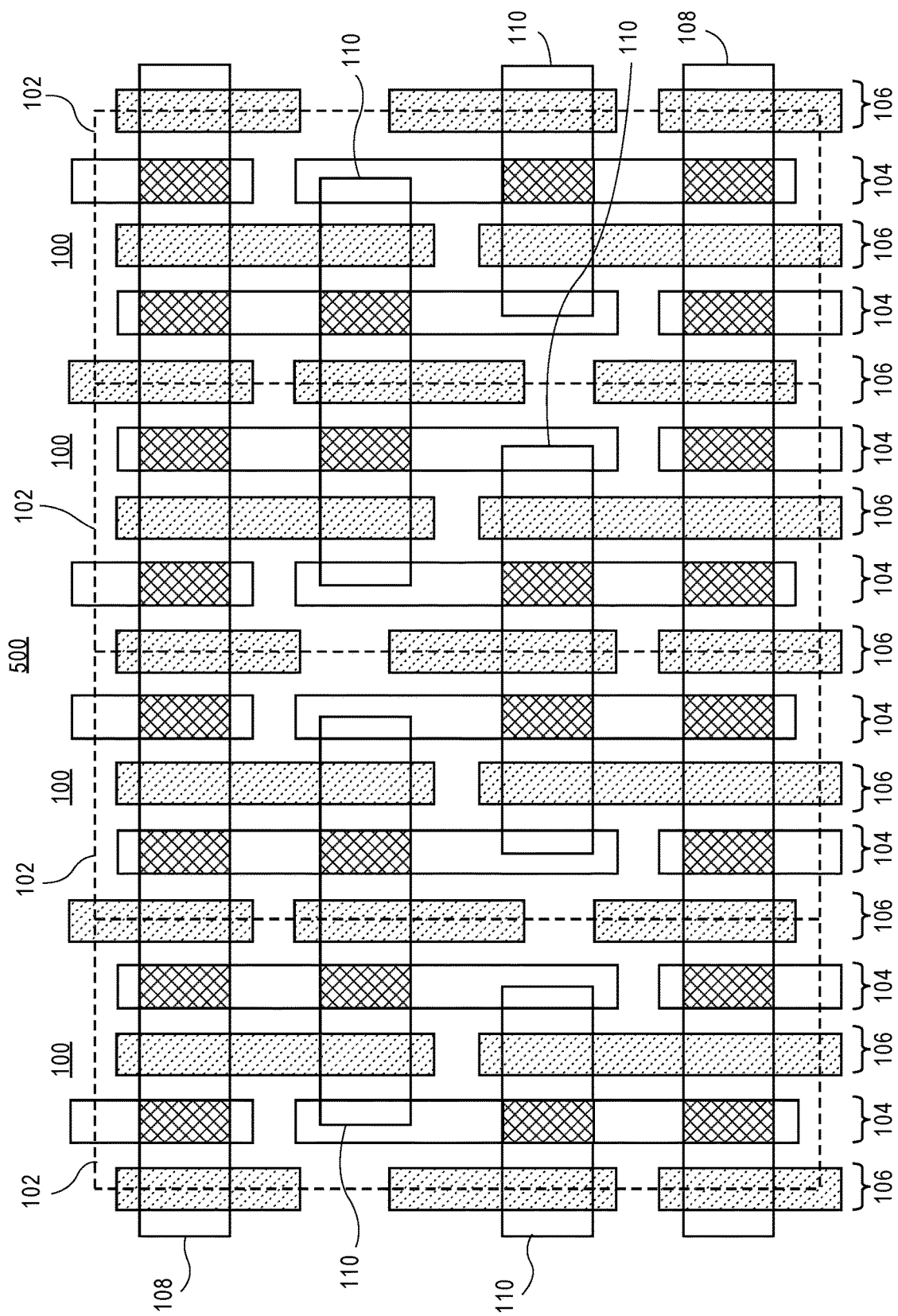
FIG. 5 illustrates a four-bit cell layout for a conventional six transistor (6T) static random access memory (SRAM).

For comparison with embodiments of the present disclosure, FIG. 5 illustrates a four-bit cell layout 500 for a conventional six transistor (6T) static random access memory (SRAM).

Referring to FIG. 5, four layouts of the type 100 are shown as neighboring bit cell areas 102. Gate lines 104 alternate with trench contact lines 106. The gate lines 104 and trench contact lines 106 are over NMOS diffusion regions 108 and PMOS diffusion regions 110.

Figure 6:
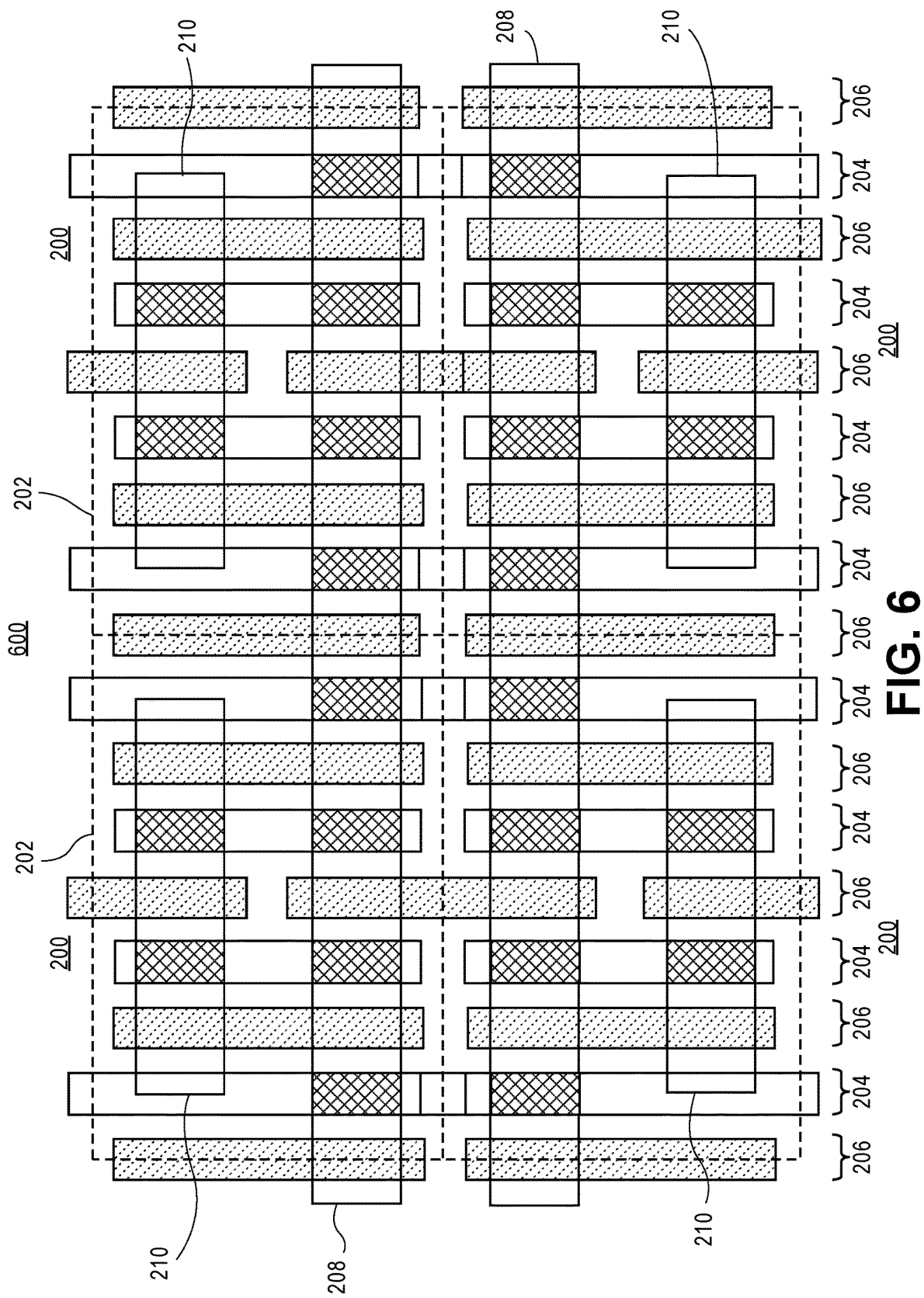
FIG. 6 illustrates a four-bit cell layout for a uniform six transistor (6T) static random access memory (SRAM), in accordance with an embodiment of the present disclosure.

In contrast to FIG. 5, FIG. 6 illustrates a four-bit cell layout for a uniform six transistor (6T) static random access memory (SRAM), in accordance with an embodiment of the present disclosure.

Referring to FIG. 6, four layouts of the type 200 are shown as neighboring bit cell areas 202. Gate lines 204 alternate with trench contact lines 206. The gate lines 204 and trench contact lines 206 are over NMOS diffusion regions 208 and PMOS diffusion regions 210.

Figure 7:
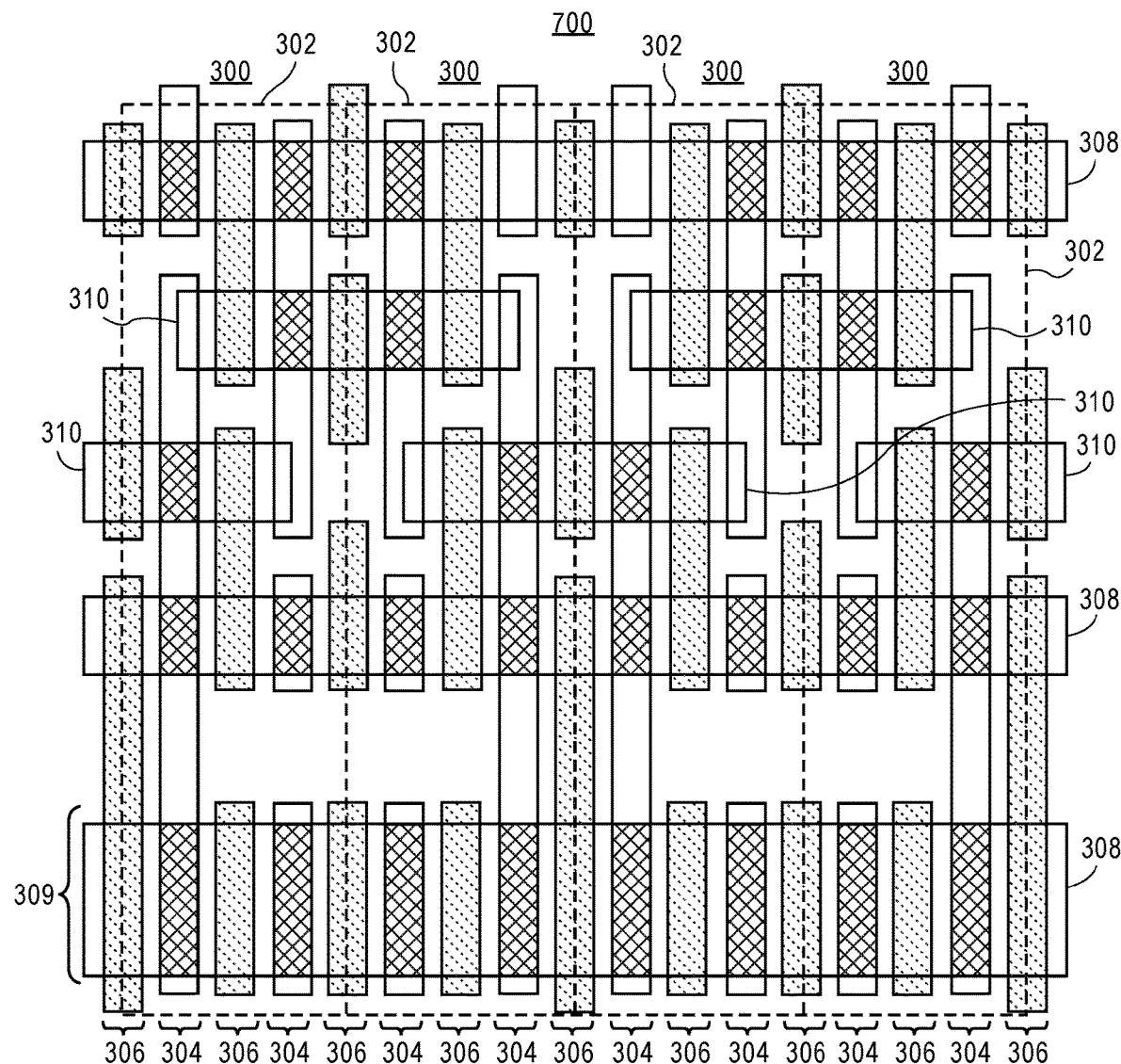
FIG. 7 illustrates a four-bit cell layout for a conventional eight transistor (8T) register file (RF).

For comparison with embodiments of the present disclosure, FIG. 7 illustrates a four-bit cell layout for a conventional eight transistor (8T) register file (RF).

Referring to FIG. 7, four layouts of the type 300 are shown as neighboring bit cell areas 302. Gate lines 304 alternate with trench contact lines 306. The gate lines 304 and trench contact lines 306 are over NMOS diffusion regions 308 and PMOS diffusion regions 310.

Figure 8:
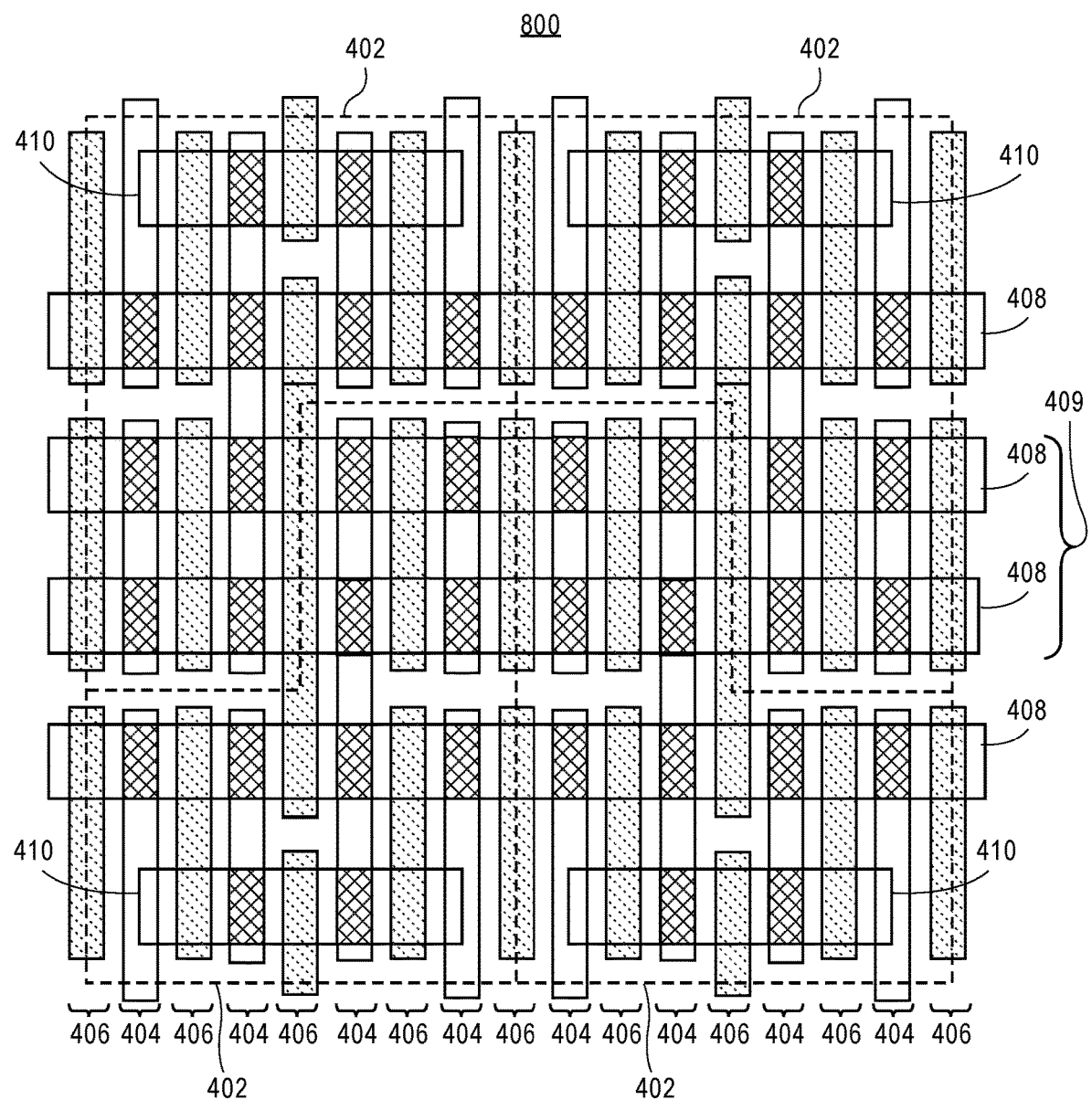
FIG. 8 illustrates a four-bit cell layout for a uniform eight transistor (8T) register file (RF), in accordance with an embodiment of the present disclosure.

In contrast to FIG. 7, FIG. 8 illustrates a four-bit cell layout for a uniform eight transistor (8T) register file (RF), in accordance with an embodiment of the present disclosure.

Referring to FIG. 8, four layouts of the type 400 are shown as neighboring bit cell areas 402. Gate lines 404 alternate with trench contact lines 406. The gate lines 404 and trench contact lines 406 are over NMOS diffusion regions 408 and PMOS diffusion regions 410.

In another aspect, the uniform mask 1-read 1-write 8T RF can be extended to support a 2-read 1-write 10T RF, where a second read port is laid out opposite a first read port. As an example, FIG. 9 illustrates a layout 900 for a uniform ten transistor (10T) 2-read 1-write register file (RF), in accordance with an embodiment of the present disclosure.

Figure 9:
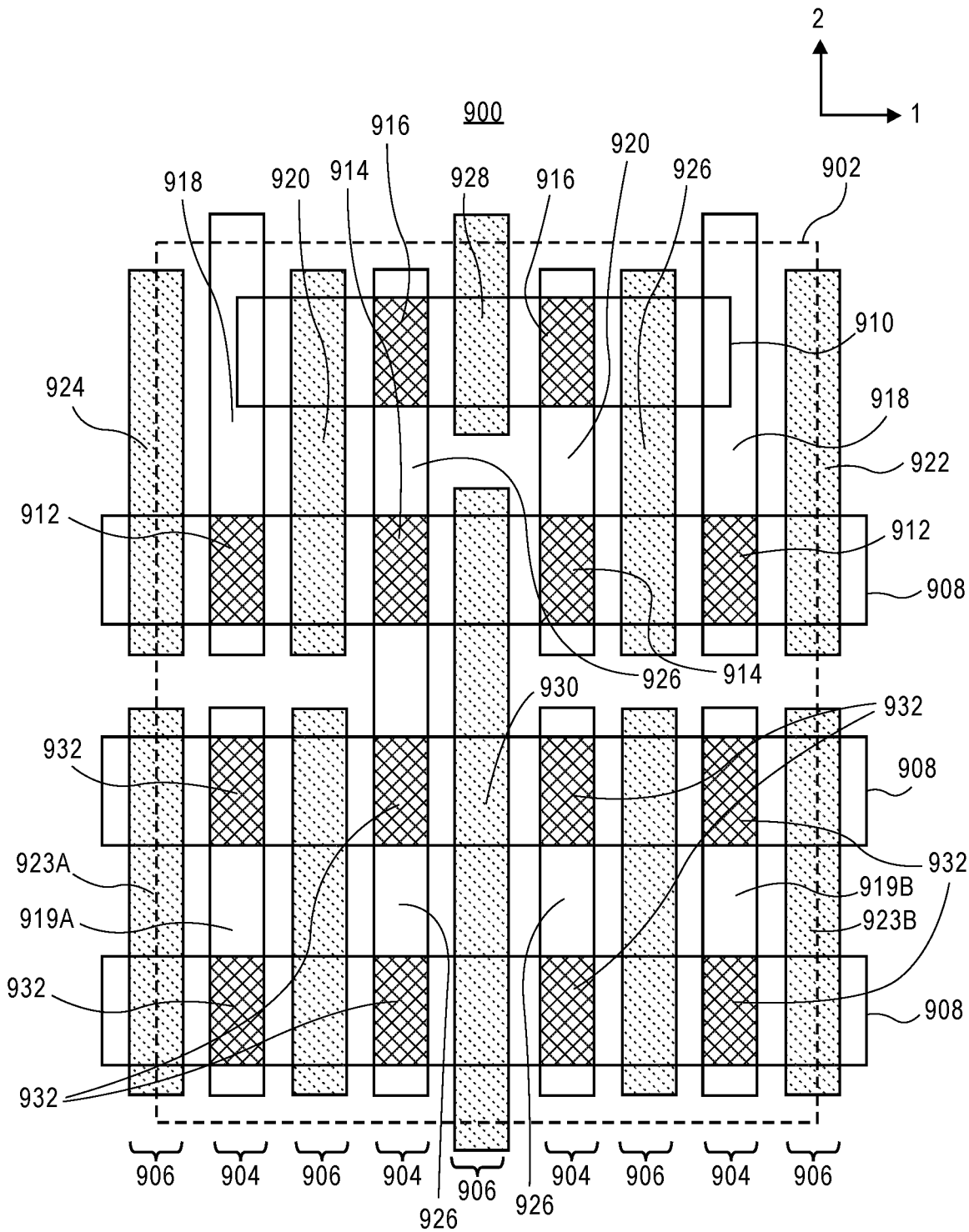
FIG. 9 illustrates a layout for a uniform ten transistor (10T) 2-read 1-write register file (RF), in accordance with an embodiment of the present disclosure.

Referring to FIG. 9, a bit cell area 902 includes therein gate lines 904 (which may also be referred to as poly lines). Trench contact lines 906 alternate with the gate lines 904. The gate lines 904 and trench contact lines 906 are over NMOS diffusion regions 908 (e.g., P-type doped active regions, such as boron doped diffusion regions of an underlying substrate) and a single PMOS diffusion region 910 (e.g., an N-type doped active region, such as a phosphorous and/or arsenic doped diffusion region of an underlying substrate). In the example of FIG. 9, each of the NMOS diffusion regions 908 and the PMOS diffusion region 910 has the same gate "width" which may be, e.g., a single semiconductor fin. Access transistors 912, N-type cell transistors 914, P-type cell transistors 916, and read port transistors 932 are formed from the gate lines 904 and the NMOS diffusion regions 908 and the PMOS diffusion region 910. Also depicted are a write wordline (WWL) 918, read wordlines (RWL) 919A/919B, a bit bar (BB) 920, a write bit line (BL) 922, read bit lines (BL) 923A/923B, a write bit line bar (BLB) 924, internal node storage (BT) 926, RF VCC 928, and VSS 930.

Referring more generally to FIG. 9, in accordance with an embodiment of the present disclosure, an integrated circuit structure includes a ten transistor (10T) 2-read 1-write register file (RF) bit cell 902 on a substrate. The 10T 2-read 1-write RF bit cell 902 includes first 910, second 908, third 908 and fourth 908 active regions (from top to bottom of FIG. 9) parallel along a first direction (1) of the substrate. First, second, third and fourth gate lines 904 are over the first 910, second 908, third 908 and fourth 908 active regions. The first, second, third and fourth gate lines 904 are parallel along a second direction (2) of the substrate, the second direction (2) perpendicular to the first direction (1). The first, third and fourth gate lines 904 (as taken from the left-hand-side of FIG. 9 to the right-hand side of FIG. 9) are discontinuous between the second and third active regions, and the second gate line is continuous between the second and third active regions, as is depicted in FIG. 9.

In one embodiment, the first active region 910 is an N-type doped active region, and the second, third and fourth active regions 908 are P-type doped active regions. In one embodiment, the first 910, second 908, third 908 and fourth 908 active regions are in first, second, third and fourth silicon fins, respectively. In one embodiment, individual ones of the first, second, third and fourth gate lines 904 are spaced apart from one another by trench contact lines 906 parallel along the second direction (2) of the substrate, as is depicted in FIG. 9.

In another aspect, a variation of the 2-read 1-write 10T RF includes balanced loading on the state nodes (BT, BB) of the RF, where a first read port is coupled to a state node BT, and a second read port is coupled to a complementary state node BB. When the second read port is accessed, an inverted value is read out. As an example, FIG. 10 illustrates a layout 1000 for a uniform ten transistor (10T) 2-read 1-write register file (RF) with balanced load, in accordance with an embodiment of the present disclosure.

Figure 10:
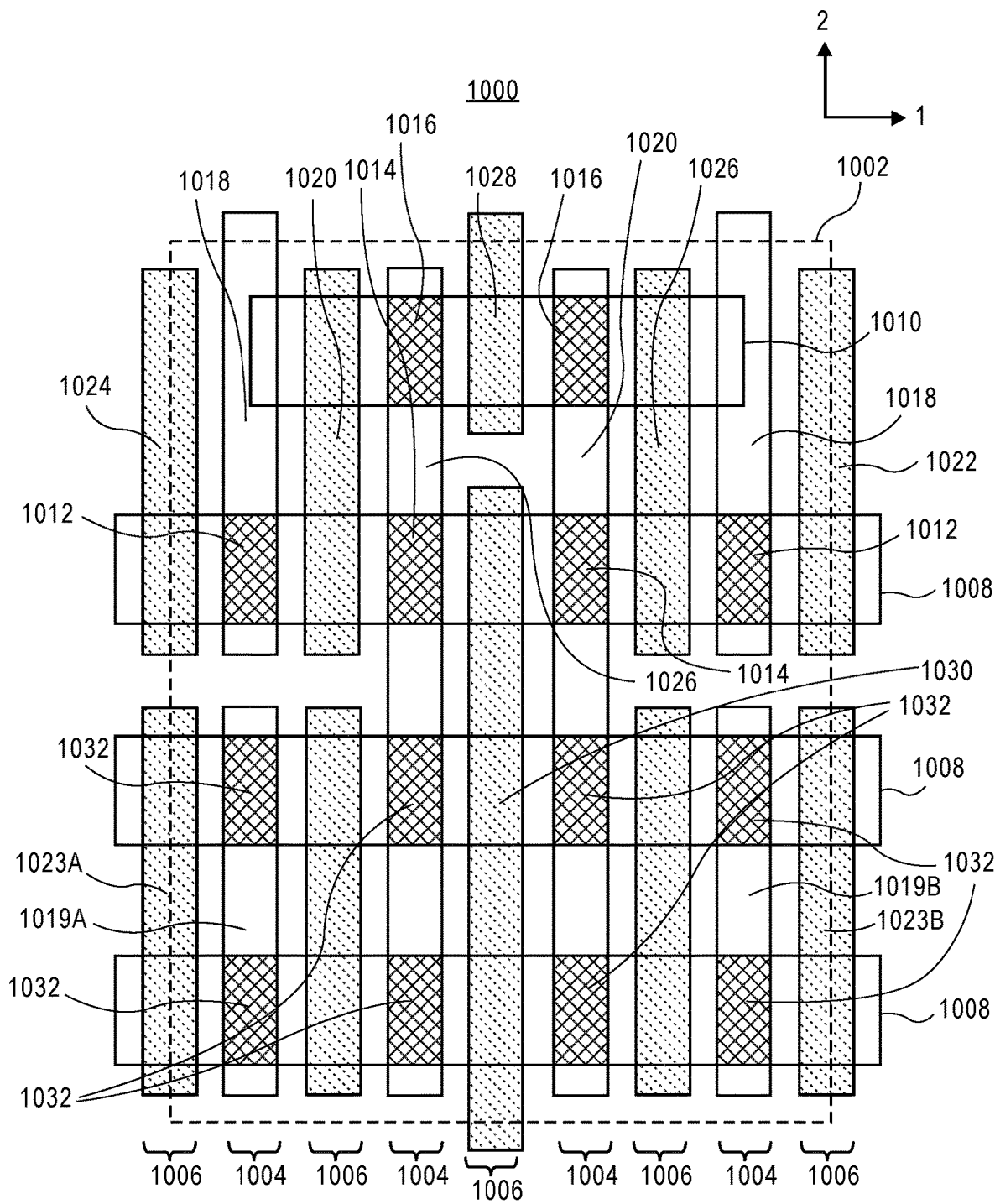
FIG. 10 illustrates a layout for a uniform ten transistor (10T) 2-read 1-write register file (RF) with balanced load, in accordance with an embodiment of the present disclosure.

Referring to FIG. 10, a bit cell area 1002 includes therein gate lines 1004 (which may also be referred to as poly lines). Trench contact lines 1006 alternate with the gate lines 1004. The gate lines 1004 and trench contact lines 1006 are over NMOS diffusion regions 1008 (e.g., P-type doped active regions, such as boron doped diffusion regions of an underlying substrate) and a single PMOS diffusion region 1010 (e.g., an N-type doped active region, such as a phosphorous and/or arsenic doped diffusion region of an underlying substrate). In the example of FIG. 10, each of the NMOS diffusion regions 1008 and the PMOS diffusion region 1010 has the same gate "width" which may be, e.g., a single semiconductor fin. Access transistors 1012, N-type cell transistors 1014, P-type cell transistors 1016, and read port transistors 1032 are formed from the gate lines 1004 and the NMOS diffusion regions 1008 and the PMOS diffusion region 1010. Also depicted are a write wordline (WWL) 1018, read wordlines (RWL) 1019A/1019B, a bit bar (BB) 1020, a write bit line (BL) 1022, read bit lines (BL) 1023A/1023B, a write bit line bar (BLB) 1024, internal node storage (BT) 1026, RF VCC 1028, and VSS 1030.

Referring more generally to FIG. 10, in accordance with an embodiment of the present disclosure, an integrated circuit structure includes a ten transistor (10T) 2-read 1-write register file (RF) bit cell 902 on a substrate. The 10T 2-read 1-write RF bit cell 1002 includes first 1010, second 1008, third 1008 and fourth 1008 active regions (from top to bottom of FIG. 10) parallel along a first direction (1) of the substrate. First, second, third and fourth gate lines 1004 are over the first 1010, second 1008, third 1008 and fourth 1008 active regions. The first, second, third and fourth gate lines 1004 are parallel along a second direction (2) of the substrate, the second direction (2) perpendicular to the first direction (1). The first and fourth gate lines 1004 (as taken from the left-hand-side of FIG. 10 to the right-hand side of FIG. 10) are discontinuous between the second and third active regions, and the second and third gate lines 1010 are continuous between the second and third active regions, as is depicted in FIG. 10.

In one embodiment, the first active region 1010 is an N-type doped active region, and the second, third and fourth active regions 1008 are P-type doped active regions. In one embodiment, the first 1010, second 1008, third 1008 and fourth 1008 active regions are in first, second, third and fourth silicon fins, respectively. In one embodiment, individual ones of the first, second, third and fourth gate lines 1004 are spaced apart from one another by trench contact lines 1006 parallel along the second direction (2) of the substrate, as is depicted in FIG. 10.

In accordance with an embodiment of the present disclosure, a uniform mask SRAM or RF approach as described above provides a layout-efficient memory implementation in advanced self-aligned process technologies. Advantages may be realized in terms of die area and memory performance. Circuit techniques may be uniquely enabled by such layout approaches.

Figure 11A:
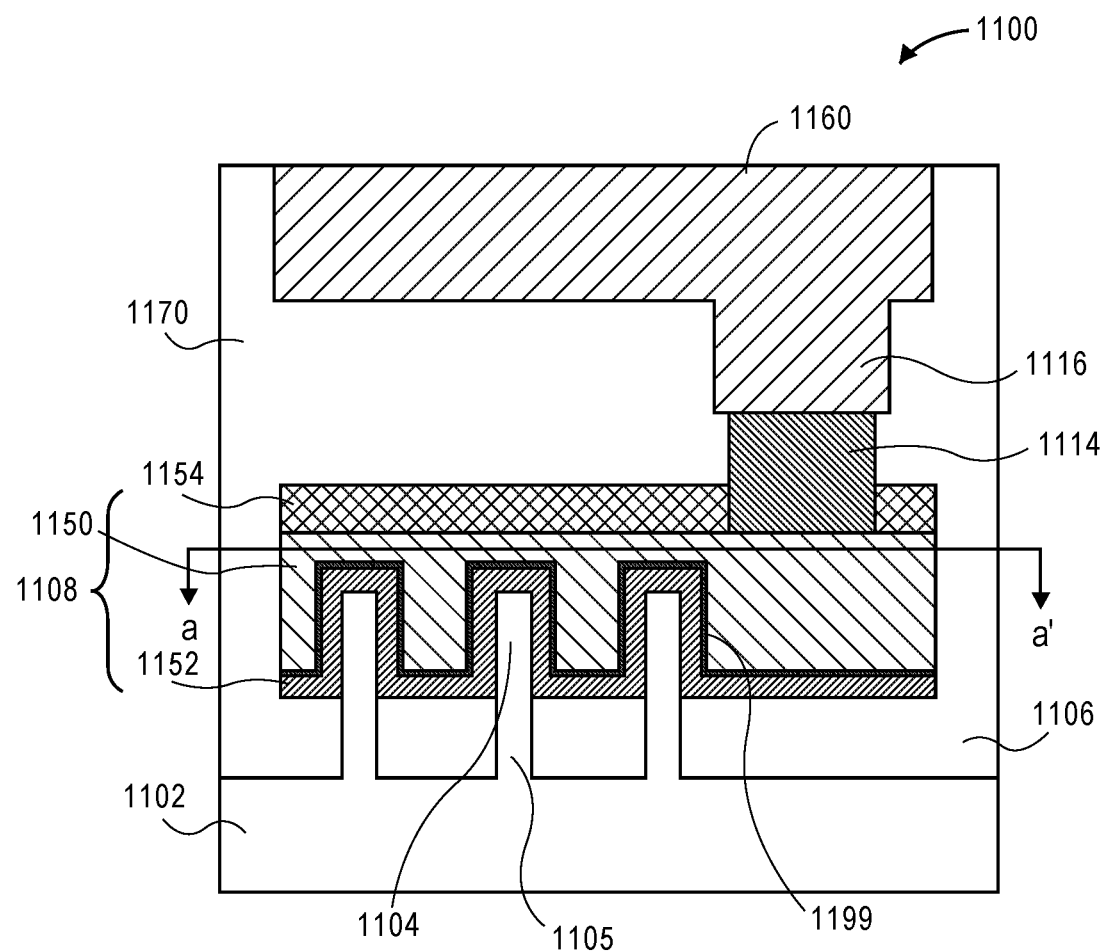
FIG. 11A illustrates a cross-sectional view of a non-planar semiconductor device, in accordance with an embodiment of the present disclosure.
Figure 11B:
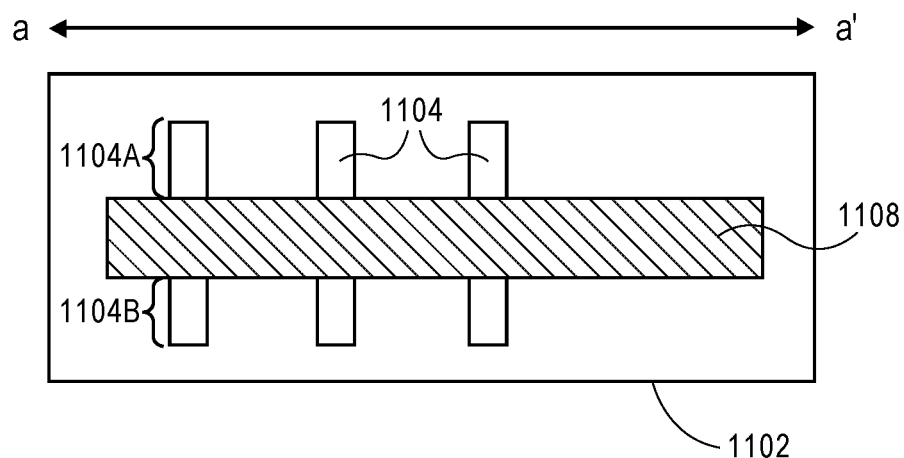
FIG. 11B illustrates a plan view taken along the a-a' axis of the semiconductor device of FIG. 11A, in accordance with an embodiment of the present disclosure.

One or more embodiments described herein are directed to the integration of semiconductor devices, such as metal oxide semiconductor (MOS) device integration. As an example, FIG. 11A illustrates a cross-sectional view of a non-planar semiconductor device, in accordance with an embodiment of the present disclosure. FIG. 11B illustrates a plan view taken along the a-a' axis of the semiconductor device of FIG. 11A, in accordance with an embodiment of the present disclosure.

Referring to FIG. 11A, a semiconductor structure or device 1100 includes a non-planar active region (e.g., a fin structure including protruding fin portion 1104 and sub-fin region 1105) formed from substrate 1102, and within isolation region 1106. A gate line 1108 is disposed over the protruding portions 1104 of the non-planar active region as well as over a portion of the isolation region 1106. As shown, gate line 1108 includes a gate electrode 1150/1199 and a gate dielectric layer 1152. In one embodiment, gate line 1108 may also include a dielectric cap layer 1154. A gate contact 1114, and overlying gate contact via 1116 are also seen from this perspective, along with an overlying metal interconnect 1160, all of which are disposed in inter-layer dielectric stacks or layers 1170.

Also seen from the perspective of FIG. 11A, the gate contact 1114 is, in one embodiment, disposed over isolation region 1106, but not over the non-planar active regions. However, the arrangement of semiconductor structure or device 1100 places the gate contact over isolation regions. Such an arrangement may, for certain technology nodes be viewed as inefficient use of layout space in certain applications. In another embodiment, a semiconductor device has contact structures that contact portions of a gate electrode formed over an active region.

It is to be appreciated that, for convenience of illustration, the gate line 1108 is shown over three protruding fin portions 1104, but is not limited as such. For example, a gate line can be formed over 1, 2, 4 or even more protruding fin portions. As is applicable throughout the present disclosure, the protruding fin portions 1104 may be referred to as forming a grating structure. In an embodiment, the term "grating" for protruding fin portions 1104 is used herein to refer to a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, the grating-like patterns described herein may have protruding fin portions 1104 spaced at a constant pitch and having a constant width. The pattern may be fabricated by a pitch halving or pitch quartering, or other pitch division, approach.

Referring to FIG. 11B, the gate line 1108 is shown as disposed over the protruding fin portions 1104. Source and drain regions 1104A and 1104B of the protruding fin portions 1104 can be seen from this perspective. In one embodiment, the source and drain regions 1104A and 1104B are doped portions of original material of the protruding fin portions 1104. In another embodiment, the material of the protruding fin portions 1104 is removed and replaced with another semiconductor material, e.g., by epitaxial deposition. In either case, the source and drain regions 1104A and 1104B may extend below the height of dielectric layer 1106, i.e., into the sub-fin region 1105.

In an embodiment, the semiconductor structure or device 1100 is a non-planar device such as, but not limited to, a fin-FET or a tri-gate device. In such an embodiment, a corresponding semiconducting channel region is composed of or is formed in a three-dimensional body. In one such embodiment, the gate electrode and gate electrode materials of gate lines 1108 surround at least a top surface and a pair of sidewalls of the three-dimensional body.

Substrate 1102 may be composed of a semiconductor material that can withstand a manufacturing process and in which charge can migrate. In an embodiment, substrate 1102 is a bulk substrate composed of a crystalline silicon, silicon/germanium or germanium layer doped with a charge carrier, such as but not limited to phosphorus, arsenic, antimony, boron, gallium or a combination thereof, to form active region 1104. In one embodiment, the concentration of silicon atoms in bulk substrate 1102 is greater than 97%. In another embodiment, bulk substrate 1102 is composed of an epitaxial layer grown atop a distinct crystalline substrate, e.g. a silicon epitaxial layer grown atop a boron-doped bulk silicon mono-crystalline substrate. Bulk substrate 1102 may alternatively be composed of a group III-V material. In an embodiment, bulk substrate 1102 is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, bulk substrate 1102 is composed of a III-V material and the charge-carrier dopant impurity atoms are ones such as, but not limited to, magnesium, beryllium, zinc, carbon, silicon, germanium, oxygen, sulfur, selenium or tellurium.

Isolation region 1106 may be composed of a material suitable to ultimately electrically isolate, or contribute to the isolation of, portions of a permanent gate structure from an underlying bulk substrate or isolate active regions formed within an underlying bulk substrate, such as isolating fin active regions. For example, in one embodiment, the isolation region 1106 is composed of a dielectric material such as, but not limited to, silicon dioxide, silicon oxy-nitride, silicon nitride, or carbon-doped silicon nitride.

In an embodiment, the gate dielectric layer 1152 is composed of a high-K material. For example, in one embodiment, the gate dielectric layer 1152 is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the substrate 1102. In an embodiment, the gate dielectric layer is composed of a top high-k portion and a lower portion composed of an oxide of a semiconductor material. In one embodiment, the gate dielectric layer 1152 is composed of a top portion of hafnium oxide and a bottom portion of silicon dioxide or silicon oxy-nitride.

In an embodiment, layer 1150 of the gate electrode 1150/1199 is composed of a non-workfunction-setting conductive fill material formed above a workfunction-setting layer 1199. In a particular embodiment, the transistor 1100 is an N-type (NMOS) transistor, and the workfunction-setting layer 1199 is an N-type workfunction. In another particular embodiment, the transistor 1100 is a P-type (PMOS) transistor, and the workfunction-setting layer 1199 has a P-type workfunction.

In one such embodiment, the conductive fill material 1150 includes a material such as but not limited to, tungsten (W), aluminum (Al), or copper (Cu). In one embodiment, one or more conductive barrier layers (such as titanium nitride or tantalum nitride) is between layers 1150 and 1199 of the gate electrode. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In an embodiment, the dielectric cap layer 1154 and/or dielectric spacers associated with the gate electrode stacks may be composed of a material suitable to ultimately electrically isolate, or contribute to the isolation of, a permanent gate structure from adjacent or overlying conductive contacts, such as self-aligned contacts. For example, in one embodiment, the dielectric cap layer 1154 and/or dielectric spacers are composed of a dielectric material such as, but not limited to, silicon dioxide, silicon oxy-nitride, silicon nitride, or carbon-doped silicon nitride.

Gate contact 1114, overlying gate contact via 1116, and/or overlying metal interconnect 1160 may be composed of a conductive material. In an embodiment, one or more of the contacts, interconnects or vias are composed of a metal species. The metal species may be a pure metal, such as tungsten, nickel, or cobalt, or may be an alloy such as a metal-metal alloy or a metal-semiconductor alloy (e.g., such as a silicide material). In a particular embodiment, one or more of gate contact 1114, overlying gate contact via 1116, or overlying metal interconnect 1160 includes a barrier layer and a conductive fill material. In one such embodiment, the barrier layer is composed of titanium and/or titanium nitride or tantalum and/or tantalum nitride. In an embodiment, the conductive fill material is composed of a conductive material such as, but not limited to, Cu, Al, Ti, Zr, Hf, V, Ru, Co, Ni, Pd, Pt, W, Ag, Au or alloys thereof.

In an embodiment, inter-layer dielectric stacks or layers 1170 are composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment (although not shown), providing structure 1100 involves formation of a contact pattern which is essentially perfectly aligned to an existing gate pattern while eliminating the use of a lithographic step with exceedingly tight registration budget. In one such embodiment, this approach enables the use of intrinsically highly selective wet etching (e.g., versus conventionally implemented dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in conventional approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, the gate stack structure 1108 may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structure 1100. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

In an embodiment, prior to (e.g., in addition to) forming a gate contact structure (such as a via) over an active portion of a gate and in a same layer as a trench contact via, one or more embodiments of the present disclosure include first using a gate aligned trench contact process. Such a process may be implemented to form trench contact structures for semiconductor structure fabrication, e.g., for integrated circuit fabrication. In an embodiment, a trench contact pattern is formed as aligned to an existing gate pattern. By contrast, conventional approaches typically involve an additional lithography process with tight registration of a lithographic contact pattern to an existing gate pattern in combination with selective contact etches. For example, a conventional process may include patterning of a poly (gate) grid with separate patterning of contact features.

In a particular embodiment, each of the trench contacts includes a barrier layer and a conductive fill material. In one such embodiment, the barrier layer is composed of titanium and/or titanium nitride or tantalum and/or tantalum nitride. In an embodiment, the conductive fill material is composed of a conductive material such as, but not limited to, Cu, Al, Ti, Zr, Hf, V, Ru, Co, Ni, Pd, Pt, W, Ag, Au or alloys thereof.

It is to be appreciated that not all aspects of the processes described above need be practiced to fall within the spirit and scope of embodiments of the present disclosure. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a trigate device, an independently accessed double gate device, or a FIN-FET. One or more embodiments may be particularly useful for fabricating semiconductor devices at a 10 nanometer (10 nm) or smaller technology node.

In an embodiment, as is also used throughout the present description, lithographic operations are performed using 193 nm immersion lithography (i193), extreme ultra-violet (EUV) and/or electron beam direct write (EBDW) lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 12:
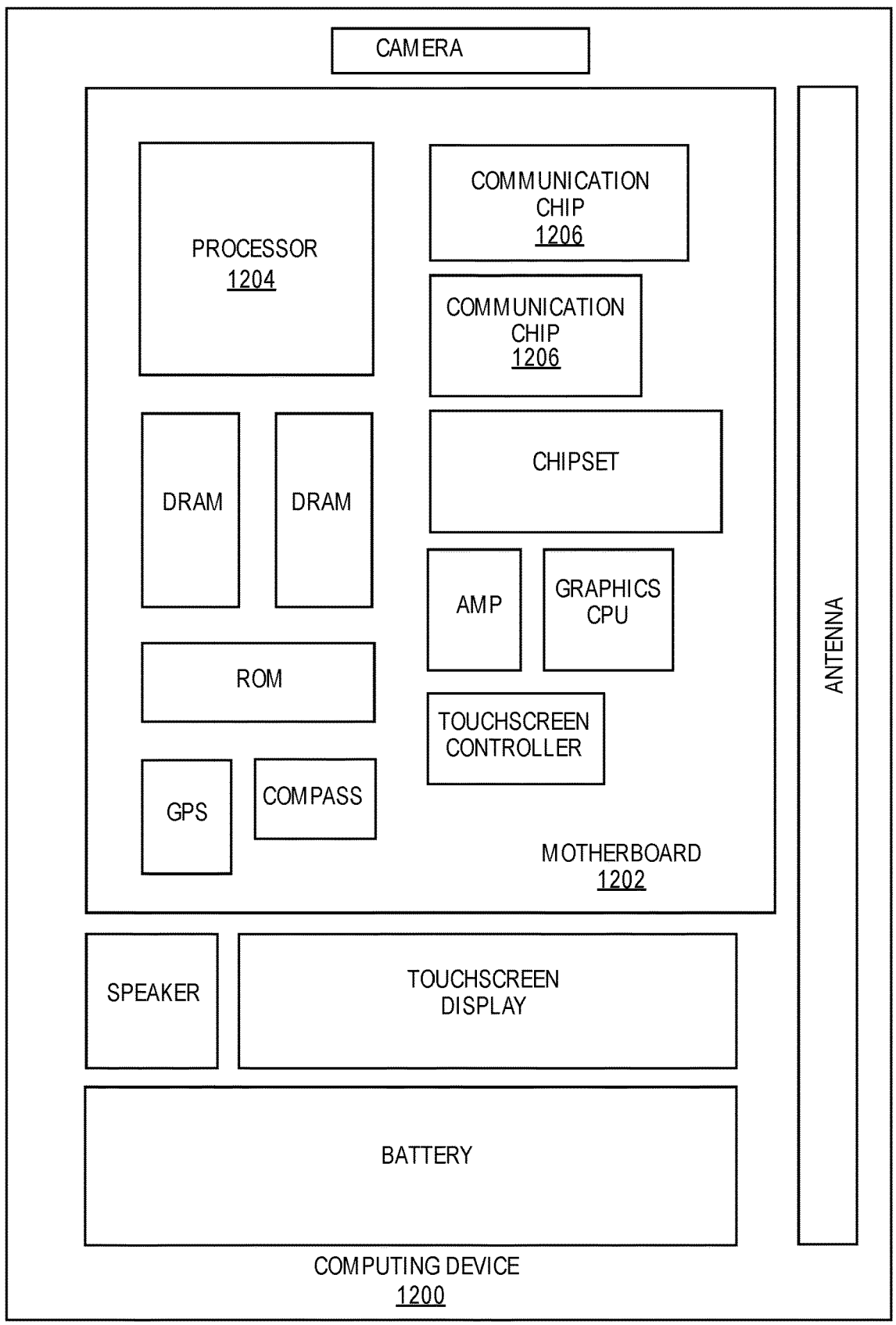
FIG. 12 illustrates a computing device in accordance with one implementation of an embodiment of the disclosure.

FIG. 12 illustrates a computing device 1200 in accordance with one implementation of the disclosure. The computing device 1200 houses a board 1202. The board 1202 may include a number of components, including but not limited to a processor 1204 and at least one communication chip 1206. The processor 1204 is physically and electrically coupled to the board 1202. In some implementations the at least one communication chip 1206 is also physically and electrically coupled to the board 1202. In further implementations, the communication chip 1206 is part of the processor 1204.

Depending on its applications, computing device 1200 may include other components that may or may not be physically and electrically coupled to the board 1202. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1206 enables wireless communications for the transfer of data to and from the computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1206 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1200 may include a plurality of communication chips 1206. For instance, a first communication chip 1206 may be dedicated to shorter range wireless communications such as Wi-Fi and Bluetooth and a second communication chip 1206 may be dedicated to longer range wireless communications such as GPS, EDGE, GPRS, CDMA, WiMAX, LTE, Ev-DO, and others.

The processor 1204 of the computing device 1200 includes an integrated circuit die packaged within the processor 1204. In some implementations of the disclosure, the integrated circuit die of the processor includes uniform layouts for SRAM or register file bit cells, in accordance with implementations of embodiments of the disclosure. The term "processor" may refer to any device or portion of a device that processes electronic data from registers and/or memory to transform that electronic data into other electronic data that may be stored in registers and/or memory.

The communication chip 1206 also includes an integrated circuit die packaged within the communication chip 1206. In accordance with another implementation of embodiments of the disclosure, the integrated circuit die of the communication chip includes uniform layouts for SRAM or register file bit cells, in accordance with implementations of embodiments of the disclosure.

In further implementations, another component housed within the computing device 1200 may contain an integrated circuit die that includes uniform layouts for SRAM or register file bit cells, in accordance with implementations of embodiments of the disclosure.

In various implementations, the computing device 1200 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1200 may be any other electronic device that processes data.

Figure 13:
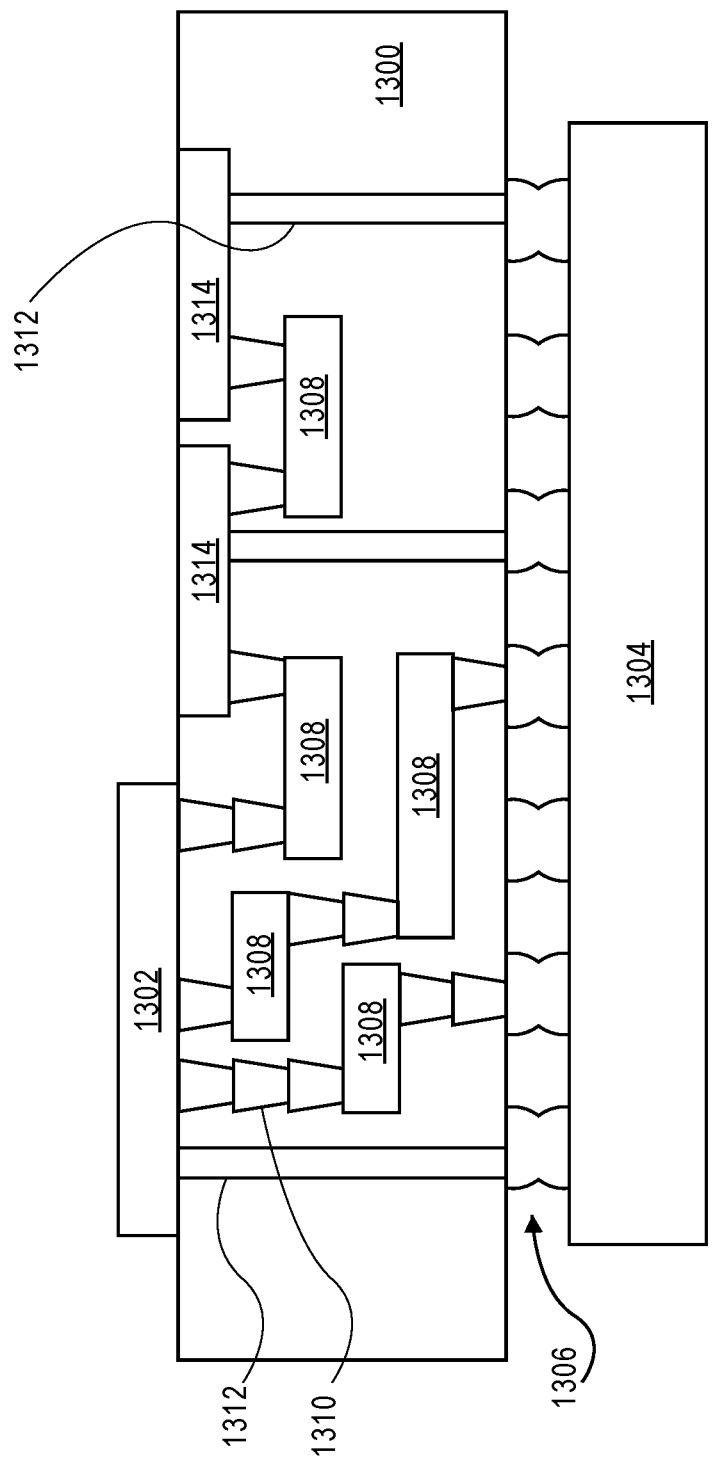
FIG. 13 is an interposer implementing one or more embodiments of the disclosure.

FIG. 13 illustrates an interposer 1300 that includes one or more embodiments of the disclosure. The interposer 1300 is an intervening substrate used to bridge a first substrate 1302 to a second substrate 1304. The first substrate 1302 may be, for instance, an integrated circuit die. The second substrate 1304 may be, for instance, a memory module, a computer motherboard, or another integrated circuit die. Generally, the purpose of an interposer 1300 is to spread a connection to a wider pitch or to reroute a connection to a different connection. For example, an interposer 1300 may couple an integrated circuit die to a ball grid array (BGA) 1306 that can subsequently be coupled to the second substrate 1304. In some embodiments, the first and second substrates 1302/1304 are attached to opposing sides of the interposer 1300. In other embodiments, the first and second substrates 1302/1304 are attached to the same side of the interposer 1300. And in further embodiments, three or more substrates are interconnected by way of the interposer 1300.

The interposer 1300 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1308 and vias 1310, including but not limited to through-silicon vias (TSVs) 1312. The interposer 1300 may further include embedded devices 1314, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1300. In accordance with embodiments of the disclosure, apparatuses or processes disclosed herein may be used in the fabrication of interposer 1300.

Thus, embodiments described herein include uniform layouts for SRAM and register file bit cells.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example Embodiment 1

An integrated circuit structure includes a six transistor (6T) static random access memory (SRAM) bit cell on a substrate. The 6T SRAM bit cell includes first and second active regions parallel along a first direction of the substrate. First, second, third and fourth gate lines are over the first and second active regions, the first, second, third and fourth gate lines parallel along a second direction of the substrate, the second direction perpendicular to the first direction.

Example Embodiment 2

The integrated circuit structure of example embodiment 1, wherein the first active region is an N-type doped active region, and the second active region is a P-type doped active region.

Example Embodiment 3

The integrated circuit structure of example embodiment 1 or 2, wherein the first and second active regions are in first and second silicon fins, respectively.

Example Embodiment 4

The integrated circuit structure of example embodiment 1, 2 or 3, wherein all individual ones of the first, second, third and fourth gate lines are continuous between the first and second active regions.

Example Embodiment 5

The integrated circuit structure of example embodiment 1, 2, 3 or 4, wherein the 6T SRAM bit cell has a length along the first direction and a length along the second direction, and the first length is greater than the second length.

Example Embodiment 6

The integrated circuit structure of example embodiment 1, 2, 3, 4 or 5, wherein individual ones of the first, second, third and fourth gate lines are spaced apart from one another by trench contact lines parallel along the second direction of the substrate.

Example Embodiment 7

An integrated circuit structure includes an eight transistor (8T) register file (RF) bit cell on a substrate. The 8T RF bit cell includes first, second, third and fourth active regions parallel along a first direction of the substrate. First and second gate lines are over the first, second, third and fourth active regions, the first and second gate lines parallel along a second direction of the substrate, the second direction perpendicular to the first direction. Third and fourth gate lines are over the first and second active region, but not over the third and fourth active regions, the third and fourth gate lines parallel along the second direction of the substrate.

Example Embodiment 8

The integrated circuit structure of example embodiment 7, wherein the first active region is an N-type doped active region, and the second, third and fourth active regions are P-type doped active regions.

Example Embodiment 9

The integrated circuit structure of example embodiment 7 or 8, wherein the first, second, third and fourth active regions are in first, second, third and fourth silicon fins, respectively.

Example Embodiment 10

The integrated circuit structure of example embodiment 7, 8 or 9, wherein the first gate line is discontinuous between the second and third active regions, and the second gate line is continuous between the second and third active regions.

Example Embodiment 11

The integrated circuit structure of example embodiment 7, 8, 9 or 10, wherein the 8T RF bit cell has an L-shape.

Example Embodiment 12

The integrated circuit structure of example embodiment 7, 8, 9, 10 or 11, wherein individual ones of the first, second, third and fourth gate lines are spaced apart from one another by trench contact lines parallel along the second direction of the substrate.

Example Embodiment 13

An integrated circuit structure includes a ten transistor (10T) 2-read 1-write register file (RF) bit cell on a substrate. The 10T 2-read 1-write RF bit cell includes first, second, third and fourth active regions parallel along a first direction of the substrate. First, second, third and fourth gate lines are over the first, second, third and fourth active regions, the first, second, third and fourth gate lines parallel along a second direction of the substrate, the second direction perpendicular to the first direction. The first, third and fourth gate lines are discontinuous between the second and third active regions, and the second gate line is continuous between the second and third active regions.

Example Embodiment 14

The integrated circuit structure of example embodiment 13, wherein the first active region is an N-type doped active region, and the second, third and fourth active regions are P-type doped active regions.

Example Embodiment 15

The integrated circuit structure of example embodiment 13 or 14, wherein the first, second, third and fourth active regions are in first, second, third and fourth silicon fins, respectively.

Example Embodiment 16

The integrated circuit structure of example embodiment 13, 14 or 15, wherein individual ones of the first, second, third and fourth gate lines are spaced apart from one another by trench contact lines parallel along the second direction of the substrate.

Example Embodiment 17

An integrated circuit structure includes a ten transistor (10T) 2-read 1-write register file (RF) bit cell on a substrate. The 10T 2-read 1-write RF bit cell includes first, second, third and fourth active regions parallel along a first direction of the substrate. First, second, third and fourth gate lines are over the first, second, third and fourth active regions, the first, second, third and fourth gate lines parallel along a second direction of the substrate, the second direction perpendicular to the first direction. The first and fourth gate lines are discontinuous between the second and third active regions, and the second and third gate lines are continuous between the second and third active regions.

Example Embodiment 18

The integrated circuit structure of example embodiment 17, wherein the first active region is an N-type doped active region, and the second, third and fourth active regions are P-type doped active regions.

Example Embodiment 19

The integrated circuit structure of example embodiment 17 or 18, wherein the first, second, third and fourth active regions are in first, second, third and fourth silicon fins, respectively.

Example Embodiment 20

The integrated circuit structure of example embodiment 17, 18 or 19, wherein individual ones of the first, second, third and fourth gate lines are spaced apart from one another by trench contact lines parallel along the second direction of the substrate.

What is claimed is:

1. An integrated circuit structure, comprising:
   a substrate;
   a six transistor (6T) static random access memory (SRAM) bit cell on the substrate, the 6T SRAM bit cell comprising:
      first and second active regions parallel along a first direction of the substrate; and
      first, second, third and fourth gate lines over the first and second active regions, the first, second, third and fourth gate lines parallel along a second direction of the substrate, the second direction perpendicular to the first direction, wherein all of the first, second, third and fourth gate lines vertically overlap one of the first active region or the second active region, and wherein at least two of the first, second, third or fourth gate lines vertically overlap both of the first active region and the second active region.

2. The integrated circuit structure of claim 1, wherein the first active region is an N-type doped active region, and the second active region is a P-type doped active region.

3. The integrated circuit structure of claim 1, wherein the first and second active regions are in first and second silicon fins, respectively.

4. The integrated circuit structure of claim 1, wherein all individual ones of the first, second, third and fourth gate lines are continuous between the first and second active regions.

5. The integrated circuit structure of claim 1, wherein the 6T SRAM bit cell has a first length along the first direction and a second length along the second direction, and the first length is greater than the second length.

6. The integrated circuit structure of claim 1, wherein individual ones of the first, second, third and fourth gate lines are spaced apart from one another by trench contact lines parallel along the second direction of the substrate.

7. An integrated circuit structure, comprising:
a substrate;
a six transistor (6T) static random access memory (SRAM) bit cell on the substrate, the 6T SRAM bit cell comprising:
  first and second active regions parallel along a first direction of the substrate, wherein the first active region is an N-type doped active region, and the second active region is a P-type doped active region; and
  first, second, third and fourth gate lines over the first and second active regions, the first, second, third and fourth gate lines parallel along a second direction of the substrate, the second direction perpendicular to the first direction, wherein all of the first, second, third and fourth gate lines vertically overlap one of the first active region or the second active region.

8. An integrated circuit structure, comprising:
a substrate;
a six transistor (6T) static random access memory (SRAM) bit cell on the substrate, the 6T SRAM bit cell comprising:
  first and second active regions parallel along a first direction of the substrate;
  and first, second, third and fourth gate lines over the first and second active regions, the first, second, third and fourth gate lines parallel along a second direction of the substrate, the second direction perpendicular to the first direction, wherein all of the first, second, third and fourth gate lines vertically overlap one of the first active region or the second active region;
  wherein each of the first, second, third, and fourth gate lines vertically overlap the first active region.

* * * * *